US010658131B2

(12) United States Patent
Escurier et al.

(10) Patent No.: US 10,658,131 B2
(45) Date of Patent: May 19, 2020

(54) REMOTE-CONTROL DEVICE COMPRISING A PORTABLE REMOTE CONTROL AND A WALL MOUNTING

(71) Applicant: SOMFY ACTIVITES SA, Cluses (FR)

(72) Inventors: Pierre Escurier, Bonneville (FR); Alizé Le Goueff, Cran-Gevrier (FR); Frédéric Strubi, Lyons (FR); Philippe Bajard, Lyons (FR); Thomas Desagre, Lyons (FR)

(73) Assignee: SOMFY ACTIVITES SA, Cluses (FR)

( * ) Notice: Subject to any disclaimer, the term of this patent is extended or adjusted under 35 U.S.C. 154(b) by 265 days.

(21) Appl. No.: 15/559,213

(22) PCT Filed: Feb. 29, 2016

(86) PCT No.: PCT/EP2016/054215
§ 371 (c)(1),
(2) Date: Jan. 23, 2018

(87) PCT Pub. No.: WO2016/150656
PCT Pub. Date: Sep. 29, 2016

(65) Prior Publication Data
US 2018/0137992 A1    May 17, 2018

(30) Foreign Application Priority Data

Mar. 20, 2015  (FR) ...................... 15 52341

(51) Int. Cl.
*H05K 5/00*      (2006.01)
*H01H 9/02*      (2006.01)
*H05K 5/02*      (2006.01)

(52) U.S. Cl.
CPC ........... *H01H 9/025* (2013.01); *H05K 5/0086* (2013.01); *H05K 5/023* (2013.01); *H05K 5/0204* (2013.01);

(Continued)

(58) Field of Classification Search
None
See application file for complete search history.

(56) References Cited

U.S. PATENT DOCUMENTS 8,072,766 B2 *  12/2011  Shimura ............ G07C 9/00944
                                                  174/359
8,289,716 B2 *  10/2012  Patel .................... H01H 3/122
                                                  361/728

(Continued)

FOREIGN PATENT DOCUMENTS

CN    201117077      9/2008
CN    201441248      4/2010

(Continued)

OTHER PUBLICATIONS

Chinese notification dated Apr. 13, 2018 in respect of Chinese patent application No. 201680016829.8.

(Continued)

*Primary Examiner* — Xanthia C Cunningham
(74) *Attorney, Agent, or Firm* — Wissing Miller LLP

(57) ABSTRACT

The invention relates to a remote-control device (14) which comprises a portable remote control (10) and a wall mounting (12), the portable remote control (10) comprising a housing (16) having a rear surface (40) and a front surface (42), located on either side of and at a distance from a median plane (M) of the housing (16), the housing (16) including a recess (48) open at least on the rear surface (40), the wall mounting (12) having a surface (28) for bearing against a wall along a bearing plane (P) and a head (24) projecting from the bearing plane (P), the head (24) penetrating into the recess (48) in an anchoring position of the portable remote control (10) so as to pass through the median plane (M) of the housing (16). The recess (48) is shaped so as to match the shape of the head (24). The head (24) projects in an upward oblique direction (D) relative to (Continued)

the bearing plane (P), and has at least one first oblique surface (34, 36) which, in anchoring position, is in surface contact with at least one first oblique wall (48.1, 48.2) of the recess (48). The recess (48) is preferably open on the front surface (42) of the housing (16) and forms a passage between the rear surface (40) and the front surface (42) of the housing (16), which thus forms an eyelet (46) defining the recess (48).

13 Claims, 2 Drawing Sheets

(52) U.S. Cl.
CPC ... *H01H 2231/032* (2013.01); *H01H 2300/03* (2013.01); *Y02B 90/224* (2013.01); *Y04S 20/14* (2013.01)

(56) References Cited

U.S. PATENT DOCUMENTS

| | | | | |
|---|---|---|---|---|
| 8,330,638 B2 * | 12/2012 | Altonen | ............... | H01H 9/025 341/176 |
| 8,389,857 B2 * | 3/2013 | Petrillo | ............... | H05B 39/088 174/50 |
| 8,695,934 B2 * | 4/2014 | Jensen | ............... | F16M 13/02 248/205.1 |
| 8,854,798 B1 * | 10/2014 | Mullet | ............... | H02G 3/14 175/50 |
| 9,208,965 B2 * | 12/2015 | Busby | ............... | H02G 3/14 |
| D752,556 S * | 3/2016 | Eriksen | ............... | D14/218 |
| 9,589,461 B1 * | 3/2017 | Byrne | ............... | G08C 19/00 |
| 2007/0241929 A1 * | 10/2007 | Marchetto | ............ | H01H 9/0235 340/13.24 |
| 2007/0272044 A1 | 11/2007 | Huang | | |
| 2008/0296296 A1 * | 12/2008 | Anders | ............... | H01H 23/04 220/4.02 |
| 2011/0272261 A1 * | 11/2011 | Johnson | ............... | H01H 23/02 200/339 |
| 2012/0104197 A1 * | 5/2012 | Jensen | ............... | F16M 13/02 248/205.1 |
| 2015/0357133 A1 * | 12/2015 | Keirstead | ............... | H01H 23/04 200/339 |

FOREIGN PATENT DOCUMENTS

| | | |
|---|---|---|
| CN | 201787300 | 4/2011 |
| CN | 201854521 | 6/2011 |
| CN | 204015885 | 12/2014 |
| FR | 2794928 A1 | 12/2000 |
| JP | H07327284 A | 12/1995 |

OTHER PUBLICATIONS

International Search Report and Written Opinion mailed in PCT/EP2016/054215 dated May 4, 2016.

* cited by examiner

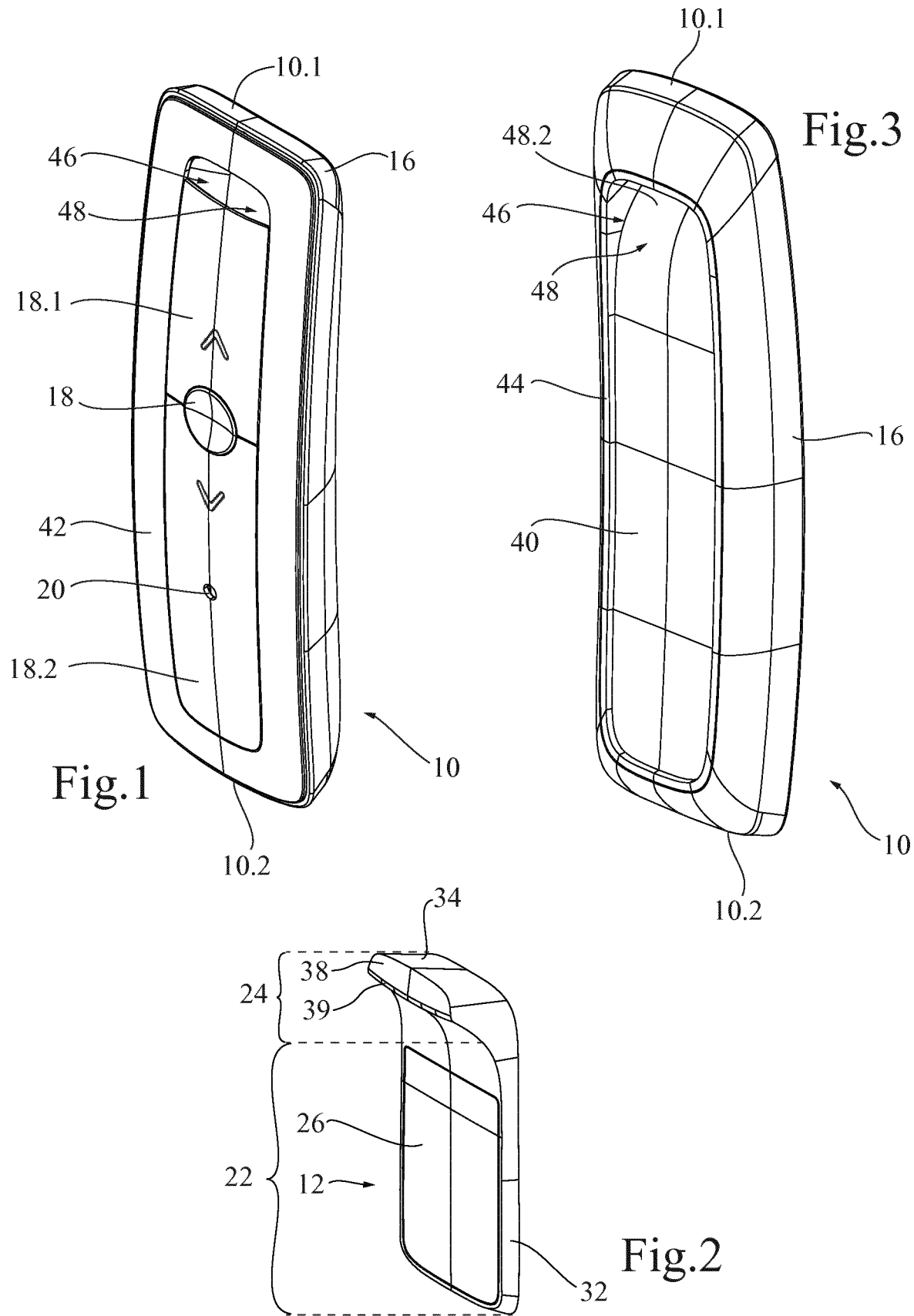

REMOTE-CONTROL DEVICE COMPRISING A PORTABLE REMOTE CONTROL AND A WALL MOUNTING

This application is a 371 of PCT/EP2016/054215 filed on Feb. 29, 2016, published on Sep. 29, 2016 under publication number WO 2016/150656, which claims priority benefits from French Patent Application No. 1552341, filed Mar. 20, 2015, the disclosure of which is incorporated herein by reference.

TECHNICAL FIELD OF THE INVENTION

The present invention relates to a remote-control device comprising a portable remote control and its wall mounting, in particular for remotely controlling home automation equipment in a building.

BACKGROUND OF THE INVENTION

The installation instructions for the Telis® remote control by the company Somfy® dated May 2006 and available at the address https://www.somfy.fr/file.cfm/ notice_telis1rts.pdf?contentID=389780 illustrate an example of a portable remote control, i.e., able to be held in the hand and move while remaining functional, therefore including at least one autonomous power source and means for remote wireless communication with home automation equipment, which can be anchored to a wall mounting, which can be positioned in any desired location, for example near the home automation equipment paired to the remote control, or at the entrance to a room, to store the remote control. To that end, the housing of the remote control has an eyelet in which a head of a rod is housed, said rod being fastened in the wall and constituting the mounting, thereby making it possible to attach the remote control to the mounting. However, it is observed with use that it is not always easy to attach the remote control, in particular because when approaching the wall, the user naturally presents the remote control with an incline that does not facilitate the insertion of the head of the mounting in the eyelet. Furthermore, the size of the head of the mounting is intentionally reduced so as not to protrude too much from the surface of the wall, such that the anchoring is not very secure. Lastly, the head has a cylindrical shape and forms a pivot, such that the anchored remote control is supposed to find a vertical position by gravity. Thus, if the remote control is jostled, it tends to swing, or even leave its mounting. Furthermore, these degrees of freedom require, when one wishes to use the remote control on its mounting, keeping it in position with one hand while manipulating it with the other.

BRIEF DESCRIPTION OF THE INVENTION

The invention seeks to resolve at least some of the drawbacks of the state of the art and to propose simple means for improved anchoring of a portable remote control to a wall mounting.

To that end, according to a first aspect of the invention, proposed is a remote-control device which comprises a portable remote control and a wall mounting, the portable remote control comprising a housing having a rear surface and a front surface, located on either side of and at a distance from a median plane of the housing, the housing including a recess open at least on the rear surface, the wall mounting having a surface for bearing against a wall along a bearing plane and a head projecting from the bearing plane, the head penetrating into the recess in an anchoring position of the portable remote control so as to pass through the median plane of the housing, characterized in that the recess is shaped so as to match the shape of the head, in that the head projects in an upward oblique direction relative to the bearing plane, and has at least one first oblique surface, which, in the anchoring position, is in surface contact with at least one first oblique wall of the recess.

Owing to the oblique orientation of the surfaces of the head of the support and the recess of the housing, it is possible, for a given bulk measured perpendicular to the bearing plane, to increase the area of the surfaces in contact with the head of the support and the remote control, and therefore to increase the contact or friction surface between the head and the oblique wall(s) of the recess. By shape cooperation, the recess matching the shape of the head, one also limits the play between the mounting and the remote control such that the latter is perfectly maintained. Furthermore, the orientation of the head and the recess allows indexing of the position of the remote control relative to the mounting, i.e., a unique relative position constituting the anchoring position, when the head is inserted into the recess.

The angle of the oblique surfaces is preferably smaller than 60° relative to the vertical, preferably comprised between 30° and 60°.

Preferably, at least part of the first oblique wall situated on one side of the median plane opposite the rear surface is situated in an upper half of the housing, which contributes to the stability of the remote control on the wall mounting, by gravity.

According to one preferred embodiment, the head has a second oblique surface, which, in the anchoring position, is in surface contact with at least one second oblique wall of the recess. Preferably, the first and second oblique surfaces approach one another when one moves away from the rear surface of the housing of the remote control. One thus guarantees an excellent anchoring.

Preferably, the first oblique surface of the head of the wall mounting and the first oblique wall of the recess are at least partially curved. The curvature of the oblique surfaces allows an insertion or removal of the remote control with no risk of blocking in an intermediate position that would not be that of the anchoring position. The shape of the head and the corresponding shape of the recess of the eyelet thus unambiguously define the anchoring position. The use of curved oblique surfaces also makes it possible to insert or remove the remote control with respect to the mounting, irrespective of the direction given to the remote control, i.e., whether it is vertical or slightly oblique.

According to one preferred embodiment, the recess is open on the front surface of the housing and forms a passage between the rear surface and the front surface of the housing. The housing of the remote control forms an eyelet defining the recess. Preferably, the head has an apical facet which, in the anchoring position, is flush with the front surface of the portable remote control, in shape continuity with the front surface of the portable remote control. In the anchoring position, the opening of the front surface is closed by the apical facet of the head of the wall mounting such that the front surface of the remote control appears, seen from the front, to be a remote control with no eyelet. This arrangement makes it possible to minimize the appearance of the mounting on the remote control.

Preferably, at least one edge, in particular a lower edge, of the apical facet is a rounded edge. This rounded edge makes it possible to limit the risk of blocking of the remote control relative to the mounting when the latter is placed, or more particularly when the remote control is removed from its mounting. Indeed, if the remote control is lifted by its lower part, the oblique surface of the recess may slide on the rounded edge of the apical facet of the mounting, which releases the remote control from the mounting. One thus avoids pulling out forces on the mounting. Preferably, at least one edge, in particular a lower edge, of the apical facet is a rounded edge.

It is possible to provide that the head of the wall mounting does not have a symmetry of revolution.

Preferably, the wall mounting includes a body having a planar rear bearing surface embodying the bearing plane and constituting the bearing surface, the body of the wall mounting having a front surface opposite the planar bearing surface, the rear surface of the housing of the portable remote control matching the shape of the front surface of the body of the wall mounting so as to be in surface contact with the front surface of the body of the wall mounting in the anchoring position. The conjugated shapes of the front surface of the body of the mounting and the rear surface of the remote control also contribute to perfect positioning of the remote control on the wall mounting. Surface contact also makes it possible to avoid any accumulation of dust between the wall mounting and the remote control if the remote control must remain anchored for a long period of time in a dusty environment. This arrangement also makes it possible to increase the surfaces in contact of the mounting and the remote control to ensure better maintenance of the remote control on its mounting. Preferably, the front surface of the body of the wall mounting is completely covered by the portable remote control in the anchoring position. Thus, the mounting is hidden by the remote control in the anchoring position, only its apical facet being visible.

According to one embodiment, the front surface of the body of the wall mounting is curved, preferably convex. However, a concave or planar shape is also possible.

According to one embodiment, the housing of the remote control comprises side rims that frame side surfaces of the body of the wall mounting in the anchoring position. The rims contribute to correct lateral positioning of the remote control in the anchored position.

Preferably, the side rims are made from a material different from the rear surface of the housing of the remote control. A material having a higher friction coefficient or more elasticity makes it possible to better wedge the side rims on either side of the body of the mounting.

Preferably, the rear surface of the housing of the remote control includes a lower end portion, which, in the anchoring position, is tangential to the bearing plane or less than one millimeter away from the bearing plane. The part of the rear surface of the remote control that is tangential or practically tangential to the bearing plane contributes to proper positioning of the remote control on the mounting in the anchoring position. It avoids detachment of the remote control if one presses on the lower part of the front surface of the remote control in the anchoring position.

In any cutting plane perpendicular to the oblique direction of the head, it is possible to measure a width of the head of the wall mounting perpendicular to the plane of symmetry of the wall mounting, and a thickness of the head of the wall mounting in the plane of symmetry of the wall mounting. The width is preferably larger than the thickness, preferably in a ratio greater than 3/2. The substantial width of the head contributes to good anchoring. According to one embodiment, the head has a maximum width, measured perpendicular to a reference plane containing the oblique insertion direction and perpendicular to the bearing plane, which is greater than or equal to half of a maximum width of the portable remote control, measured in the anchoring position perpendicular to the reference plane.

It is thus possible to monitor the proper anchoring of the remote control. It is also possible to provide a color contrast between the remote control and this apical facet. If there is a need for lighted identification of the wall mounting, for example for use in a service or industrial building, it is possible to consider a light-emitting diode with intermittent lighting arranged at the apical facet, powered by a battery housed in the wall mounting, or by an electrical connection to the power grid of the building, passing through the wall.

In practice, the front surface of the housing of the portable remote control is equipped with an entry interface. The entry interface may include one or several keys, a knob, a touchscreen or a combination of such elements. Preferably, one ensures that in the anchoring position, the entry interface is located completely between a lower end and an upper end of the wall mounting, or at least that the parts of the entry interface intended to experience command pressure from the user are found completely between a lower end and an upper end of the wall mounting. One thus avoid any risk of detachment of the remote control if it is actuated in the anchored position.

It should be noted that the wall mounting may also have an electric recharging function of the remote control, by electromagnetic induction between an excitation circuit situated in the head or body of the mounting, and a receiving circuit connected to a battery in the housing of the remote control.

In practice, the housing of the portable remote control preferably has a plane of symmetry perpendicular to the bearing plane in the anchored position.

According to another aspect of the invention, the latter relates to a portable remote control intended to form, with a wall mounting, a remote control device according to any one of the preceding claims, the portable remote control including a housing having a rear surface and a front surface, located on either side of and at a distance from a median plane of the housing, the housing having an upper end and a lower end, and comprising a recess open at least on the rear surface and traversing the median plane of the housing. The recess comprises at least a first upward oblique wall as one moves away from the rear surface. Preferably, at least part of the first oblique wall situated on one side of the median plane opposite the rear surface is situated in an upper half of the housing. Advantageously, the recess has a section, measured in any measuring plane parallel to the median plane of the housing, that becomes smaller when the median plane moves away from the rear surface. The remote control thus has surface continuity in the rear.

According to another aspect of the invention, the latter relates to a portable remote control intended to form, with a wall mounting, a remote control device according to any one of the preceding claims, the portable remote control including a housing having a rear surface and a front surface, located on either side of and at a distance from a median plane of the housing, the housing having an upper end and a lower end, and comprising a recess open at least on the rear surface and traversing the median plane of the housing. The recess flares on the rear surface of the housing to form an indentation of the rear surface, elongated toward the lower end of the housing, which makes it possible to attach the remote control on a mounting having a head and a body arranged below this head. The recess preferably comprises at least a first upward oblique wall as one moves away from the rear surface. Preferably, at least part of the first oblique wall situated on one side of the median plane opposite the rear surface is situated in an upper half of the housing.

BRIEF DESCRIPTION OF THE FIGURES

Other features and advantages of the invention will emerge from reading the following description, in reference to the appended figures, which illustrate:

FIG. 1, a perspective view of a portable remote control according to one embodiment of the invention, from an angle making it possible to view a front surface of a housing of the remote control;

FIG. 2, a perspective view of a wall mounting of the remote control device, associated with the portable remote control of FIG. 1;

FIG. 3, another perspective view of the portable remote control of FIG. 1, from an angle making it possible to view a rear surface of the housing of the remote control;

For greater clarity, identical elements are identified using identical reference signs in all of the figures.

DETAILED DESCRIPTION OF THE INVENTION

Figure 4:
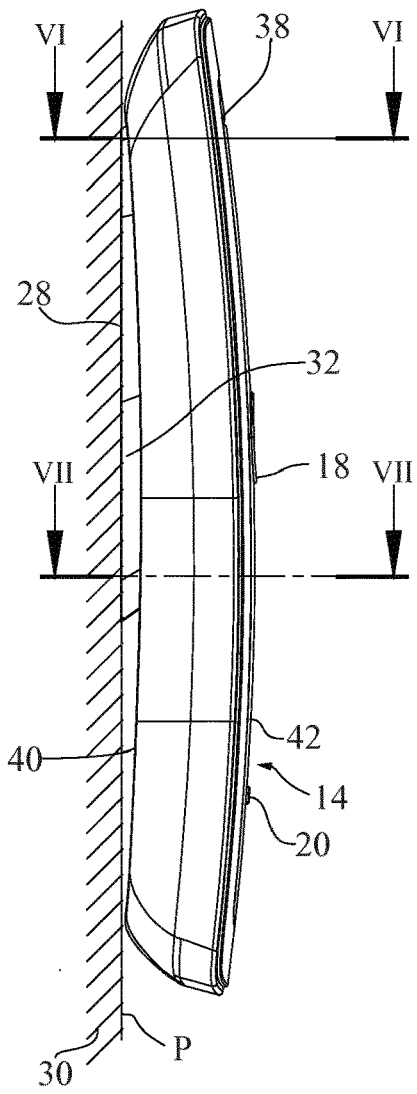
FIG. 4, a side view of a remote control device according to the invention, incorporating the remote control of FIG. 1 and the wall mounting of FIG. 2.
Figure 5:
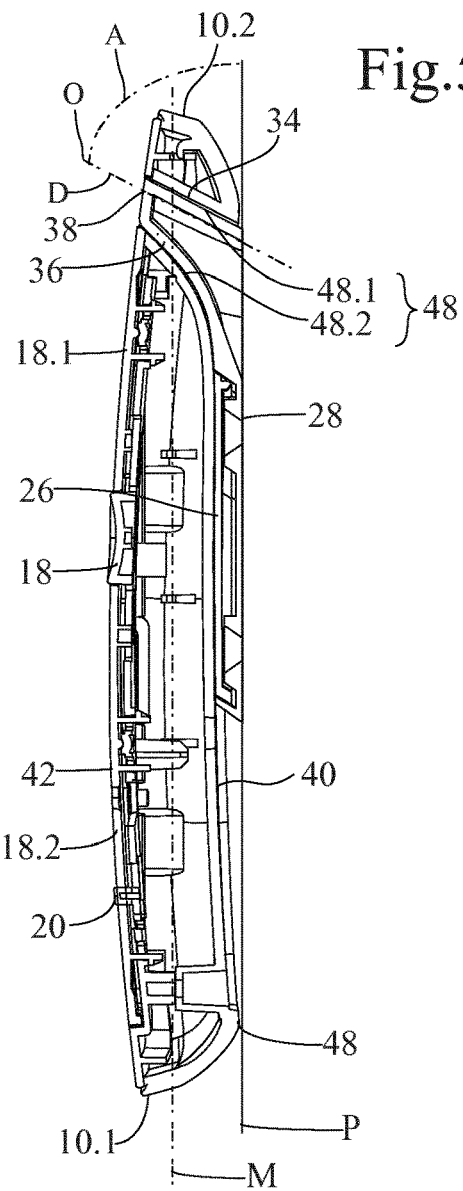
FIG. 5, a sectional view in a cutting plane V-V that constitutes a plane of symmetry of the housing of the remote control and a plane of symmetry of the wall mounting.

FIGS. 1 and 3 illustrate, from two different viewing angles, a portable remote control 10 intended to be anchored to a wall mounting 12 illustrated in FIG. 2, in an anchored position illustrated in FIGS. 3 to 5 and forming a remote control device 14 with the wall mounting.

In a manner known in itself, the portable remote control 10 is intended to be held in a user's hand and is used to control one or several pieces of home automation equipment (not shown) in a home automation installation from a variable position in a building, for example inside a room where the piece(s) of home automation equipment paired to the remote control are located.

The illustration of the portable remote control 10 has intentionally been limited to its housing 16, but one skilled in the art knows that such a remote control comprises an electronic control circuit connected to an entry interface, which is recognized here as having three keys 18, 18.1, 18.2, if applicable a visual interface, here in the form of a light-emitting diode 20, and a telecommunications interface, preferably wireless, for example by radio, as well as an energy source that may include an energy storage battery and optionally means for recharging this storage battery, which may consist for example of a photoelectric cell or a winding intended to be positioned in an electromagnetic field. Likewise, the wall mounting itself may include a power supply circuit for supplying power to a field winding.

The wall mounting 12 here is made up of two parts assembled for example by being jointed or clipped together, which together form a relatively flat elongated body 22 and a protruding head 24. The body has a slightly curved front surface 26, a rear surface 28 for bearing against a wall 30 defining a bearing plane P and side surfaces 32. The fastening of the wall mounting 12 to the wall 30 can be done using any appropriate means, for example by screws (not shown) or by gluing, if applicable using a tape with two adhesive surfaces.

The head 24 of the wall mounting 12 protrudes at an upper end of the body 22 in an upward oblique axial direction D relative to the bearing plane P. The angle A of the oblique axial direction D here is about 55°, but in practice may vary between 30° and 70°. The head 24 of the wall mounting 12 does not have a symmetry of revolution and has a section, measured in a plane parallel to the bearing plane P, that decreases as one moves away from the bearing plane P. The head 24 of the wall mounting 12 is cantilevered relative to the body 22, and thus has a rear surface 34 turned toward the bearing plane P. The head 24 also has a front surface 36 that is in the extension of the front surface 26 of the body, preferably without interrupting the slope with the latter, and an apical surface 38, which may if applicable have a different color or surface appearance from the front surface. The transition between the front surface 36 of the head and the apical surface 38 forms an edge 39 that is preferably rounded.

It is possible to define a median reference plane R of the wall mounting, perpendicular to the bearing plane P and in which the oblique axial direction D of the head 24 extends. This plane R proves to be a plane of symmetry of the wall mounting, combined with the cutting plane V-V of FIG. 5. It is possible to measure a width of the wall mounting 12, in a direction perpendicular to the reference plane R. This width is substantially constant, and in particular, the width measured at the head 24 is substantially identical, at least to within 10%, to the width measured at the body 22. It is also possible to measure a thickness of the body 22, perpendicular to the bearing plane R. One can see that the thickness of the body 22 is small relative to its width, preferably less than half, and preferably less than one quarter of the width. Similarly, it is possible to measure a thickness of the head 24, in a direction perpendicular to the oblique direction D and parallel to the reference plane R. One can see that the thickness of the head 24 is small relative to its width, preferably less than half, and preferably less than one quarter of the width.

The housing 16 of the portable remote control 10 is preferably made up of several parts and has a rear surface 40 and a front surface 42, situated on either side of and at a distance from the median plane M of the housing, as well as an upper end 10.1 and a lower end 10.2. As previously mentioned, the front surface 42 is intended to form or accommodate an entry, and if applicable, viewing interface. It may therefore be provided with one or several keys 18, 18.1, 18.2, and if applicable, a light-emitting diode 20. Naturally, other types of interfaces are possible, with screen and multiple keys, and/or touch-sensitive screen.

The rear surface 40 of the housing 16 of the portable remote control 10 is curved, in the case at hand concave, so as to match the convex curved shape of the front surface 26 of the body 22 of the wall mounting 12. The wall remote control 10 has a greater width than the wall mounting 12, and has side rims 44 that cover the side surfaces 32 of the wall mounting 12 with very small play.

Figure 6:
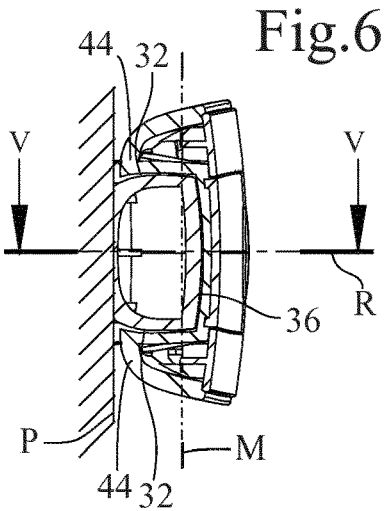
FIG. 6, a sectional view of the remote control device of FIG. 4, in a cutting plane IV-IV perpendicular to the cutting plane V-V.
Figure 7:
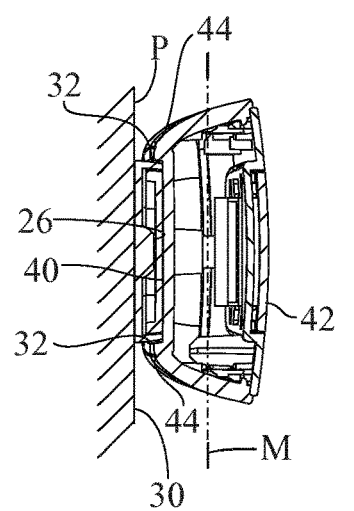
FIG. 7, a sectional view of the remote control device of FIG. 4, in a cutting plane VII-VII parallel to the cutting plane V-V.

Remarkably, the housing 16 forms a passage eyelet 46 between the rear surface 40 and the front surface 42 of the housing 16. An eyelet here refers to a hole open on both sides, at an end on the rear surface 40 and at the opposite end on the front surface 42. The eyelet 46 has an insertion axis O that is oblique relative to the median plane M of the housing, and is configured so as to define a recess 48 matching the shape of the head 24 of the wall mounting 12, such that it is possible to attach the portable remote control 10 to the wall mounting 12 in the anchoring position illustrated in FIGS. 4 to 6. In the anchoring position, the insertion axis O of the eyelet 46 is combined with the oblique direction D of the head 24. The rear surface 34 of the head 24 of the wall mounting 12 is in contact with a corresponding wall 48.1 of the recess 48, while the front surface 36 of the head 24 is in contact with a corresponding wall 40.2 of the recess 48. The walls 48.1, 48.2 are upward walls and come closer to one another as one moves away from the rear surface 40, such that the area of the section of the recess 48, measured in any plane parallel to the median plane M, decreases as one moves away from the rear surface 40. At least in their part furthest from the rear surface 40, on the side of the median plane M situated opposite the rear surface 40, the walls 48.1, 48.2 are located in an upper half of the remote control 10, i.e., are closer to the upper end 10.1 than the lower end 10.2 of the remote control 10. As illustrated in FIG. 4, the apical facet 38 is flush with a front surface 42 of the portable remote control 10, in shape continuity with the front surface 42 of the portable remote control 10. The apical facet 38 is therefore visible in the anchored position. From the front, in the anchored position, it is the only part of the wall mounting 12 that is visible and not covered by the portable remote control 10.

The portable remote control 10 has a height, measured vertically in the plane of symmetry V-V, that is greater than the height of the wall mounting 12. One thus minimizes the visual impact of the wall mounting 12 in the absence of the remote control 10 and makes the presence or absence of the remote control 10 on the wall mounting 12 more perceptible to the user. In the anchored position, an upper end of the remote control 10 protrudes from the wall mounting upward and is partially located between the wall mounting 12 and the bearing plane P. A lower end of the portable remote control 10 protrudes from the wall mounting downward, and constitutes a portion facilitating grasping of the portable remote control 10 to detach it. The rear surface 40 of the housing 16 of the remote control 10 may have, in the lower end part, a portion 48, which, in the anchored position, is practically tangential to the plane P. The tangential portion 48 may correspond to a local overthickness of the housing 16 of the portable remote control 10 and/or to a concave shape of the rear surface of the housing 16.

The conjugated shapes of the head 24 of the wall mounting 12 and the eyelet 46 of the portable remote control 10 allow effective anchoring of the portable remote control 10 and precise positioning of the portable remote control 10 on the wall mounting 12. The conjugated shapes of the rear surface 40 of the portable remote control 10 and the front surface 26 of the body 22 of the wall mounting 12, as well as the side rims 44 of the remote control 10, contribute to the proper positioning of the remote control 10. The conjugated shapes of the side rims 44 of the portable remote control 10 and the side surfaces 32 of the wall mounting 12 contribute to the proper positioning of the remote control during its manual use in the position anchored on its mounting.

Naturally, various modifications are possible. The front surface 26 of the body 22 of the wall mounting 12 may potentially be curved or planar, and the conjugated rear surface 40 of the housing 16 of the portable remote control 10 may be convex or planar. The side rims 34 of the remote control 10 may be omitted. The rear surface 28 of the wall mounting may not be planar, inasmuch as it makes it possible to define three points of contact with the wall, and therefore a single bearing plane P. The median plane M of the housing is not necessarily strictly parallel to the bearing plane P. The reference plane R is not necessarily a plane of symmetry. The body 22 of the wall mounting 12 may be omitted, or its size may be reduced.

The fact that the apical facet 38 of the head 24 of the wall mounting 12 is visible in the anchored position makes it possible to make different choices: for this apical facet, one may choose a color and a surface appearance identical to that of the remote control, for esthetic reasons. One may on the contrary choose a contrast between the apical facet 38 and the front surface 42 of the portable remote control 10 to allow the user to visually verify the proper anchoring of the portable remote control 10. In general, the anchoring mode described here allows greater freedom in choosing the forms of the mounting and the remote control, which may adapt to different aesthetics, angular or rounded.

The invention claimed is:

1. A remote-control device comprising a portable remote control and a wall mounting, the portable remote control comprising a housing having a rear surface and a front surface, located on either side of and at a distance from a median plane (M) of the housing, the housing including a recess open at least on the rear surface, the wall mounting having a surface for bearing against a wall along a bearing plane (P) and a head projecting from the bearing plane (P), the head penetrating into the recess in an anchoring position of the portable remote control so as to pass through the median plane (M) of the housing, characterized in that the recess is shaped so as to match the shape of the head, in that the head projects in an upward oblique direction (D) relative to the bearing plane (P), and has at least one first oblique surface, which, in the anchoring position, is in surface contact with at least one first oblique wall of the recess.

2. The remote control device according to claim 1, characterized in that at least part of the first oblique wall situated on one side of the median plane (M) opposite the rear surface is situated in an upper half of the housing.

3. The device according to claim 1, characterized in that the head has a second oblique surface, which, in the anchoring position, is in surface contact with at least one second oblique wall of the recess.

4. The remote control device according to claim 3, characterized in that the first and second oblique surfaces approach one another when one moves away from the rear surface of the housing of the remote control.

5. The remote control device according to claim 1, characterized in that the first oblique surface of the head of the wall mounting and the first oblique wall of the recess are at least partially curved.

6. The remote control device according to claim 1, characterized in that the recess is open on the front surface of the housing and forms a passage between the rear surface and the front surface of the housing.

7. The remote control device according to claim 6, characterized in that the head has an apical facet which, in the anchoring position, is flush with the front surface, in shape continuity with the front surface of the portable remote control.

8. The remote control device according to claim 1, characterized in that the wall mounting includes a body having a planar rear bearing surface embodying the bearing plane (P) and constituting the bearing surface, the body of the wall mounting having a front surface opposite the planar bearing surface, the rear surface of the housing of the portable remote control matching the shape of the front surface of the body of the wall mounting so as to be in surface contact with the front surface of the body of the wall mounting in the anchoring position.

9. The remote control device according to claim 8, characterized in that the front surface of the body of the wall mounting is complettley covered by the portable remote control in the anchoring position.

10. The remote control device according to claim 8, characterized in that the housing of the remote control comprises side rims that frame the side surfaces of the body of the wall mounting in the anchoring position.

11. The remote control device according to claim 8, characterized in that the rear surface of the housing of the remote control includes a lower end portion, which, in the anchoring position, is tangential to the bearing plane (P) or less than one millimeter away from the bearing plane (P).

12. The remote control device according to claim 1, characterized in that the head has a maximum width, measured perpendicular to a reference plane (R) containing the oblique insertion direction (D) and perpendicular to the bearing plane (P), which is greater than or equal to half of a maximum width of the portable remote control, measured in the anchoring position perpendicular to the reference plane (R).

13. The remote control device according to claim 1, characterized in that the front surface of the housing of the portable remote control is equipped with a grasping interface.

* * * * *